(12) United States Patent
Toyoda et al.

(10) Patent No.: US 6,862,226 B2
(45) Date of Patent: Mar. 1, 2005

(54) METHOD OF DRIVING A NON-VOLATILE FLIP-FLOP CIRCUIT USING VARIABLE RESISTOR ELEMENTS

(75) Inventors: Kenji Toyoda, Osaka (JP); Takashi Ohtsuka, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/784,257

(22) Filed: Feb. 24, 2004

(65) Prior Publication Data

US 2004/0257113 A1 Dec. 23, 2004

Related U.S. Application Data

(63) Continuation of application No. PCT/JP03/13813, filed on Oct. 29, 2003.

(30) Foreign Application Priority Data

Nov. 1, 2002 (JP) ........................................ 2002-319722

(51) Int. Cl.[7] .............................................. G11C 11/00
(52) U.S. Cl. ............................. 365/189.07; 365/189.05; 365/154; 365/185.08
(58) Field of Search ................................. 365/154, 156, 365/185.08, 189.01, 189.05, 189.07, 200, 207, 208

(56) References Cited

U.S. PATENT DOCUMENTS 5,732,015 A * 3/1998 Kazerounian et al. ...... 365/154
5,892,712 A * 4/1999 Hirose et al. ............ 365/185.07
6,175,525 B1    1/2001 Fulkerson et al.
6,222,765 B1 * 4/2001 Nojima .................... 365/185.08
6,285,575 B1    9/2001 Miwa
6,473,333 B1 * 10/2002 Tachibana et al. .......... 365/154
6,654,273 B2 * 11/2003 Miwa et al. ................ 365/145
2002/0093032 A1    7/2002 Hanzawa et al.

FOREIGN PATENT DOCUMENTS

JP      07-105685     4/1995
JP      11-162172     6/1999

* cited by examiner

Primary Examiner—Vibol Tan
(74) Attorney, Agent, or Firm—McDermott Will & Emery LLP

(57) ABSTRACT

A method of driving a non-volatile flip-flop circuit comprising a first inverter (INV1) coupled to a first memory node (9) and a second memory node (10), a second inverter (INV2) coupled to the second memory node (10) and the first memory node (9), a first pass transistor (5), a second pass transistor (6), a first switching element for control (7) and a first variable resistor element (15) which are connected serially to each other and are connected between the first memory node (9) and a plate line (18), and a second switching element for control (8) and a second variable resistor element (16) which are connected serially to each other and are connected between the second memory node (10) and the plate line (18), wherein the resistance values of the first and second variable resistor elements (15, 16) can be changed by the heat generated by a current.

13 Claims, 8 Drawing Sheets

METHOD OF DRIVING A NON-VOLATILE FLIP-FLOP CIRCUIT USING VARIABLE RESISTOR ELEMENTS

This application is a continuation of PCT/JP03/13813 filed Oct. 26, 2003.

BACKGROUND OF THE INVENTION (1) Field of the Invention

The present invention relates to a method of driving a non-volatile flip-flop circuit using variable resistor elements, especially to a method of driving a non-volatile flip-flop circuit which can operate at high speed during normal operation and perform non-volatile operation when power is removed.

(2) Description of the Related Art

In recent years, the spread of portable devices has been driving the need for the miniaturization and reduced power consumption of semiconductor devices. The need for using nonvolatile memories for portable devices is also increasing. Non-volatile memories that are in practical use today include flash memories, ferroelectric random-access memories (FeRAMs), etc. In portable devices, a non-volatile memory is sometimes contained within a logic circuit to achieve miniaturization. Furthermore, semiconductor devices, mainly such as Silicon chips, for processing data are required not only miniaturization and reduced power consumption but also increased speed. However, flash memories, which are typical non-volatile memories, have slow writing operation and need a high voltage. Therefore, flash memories are not suitable for portable devices. Accordingly, FeRAMs, which can operate faster with lower power consumption, are attracting attention. However, mounting an FeRAM on a Silicon chip entails the problem of increased process costs because of the high temperature needed for forming ferroelectric films and the use of precious metals such as Pt, etc. as electrodes. In contrast, constructing a circuit by adding a non-volatile memory externally to a Silicon chip prevents the miniaturization and reduced weight of a device since it increases the area for mounting the circuit. In addition, the operation speed of a logic device comprising Silicon chips is higher that that of the above-mentioned non-volatile memory, and therefore the input/output time of data to/from the non-volatile memory creates overhead for the processing of the logic device.

Japanese Unexamined Patent Publication No. 2000-293989 suggests a circuit configuration which makes use of both the fast operation of Silicon devices and the non-volatility of non-volatile memories. This circuit has a configuration of a flip-flop (hereinafter referred to as FF) circuit, which is often used for Silicon devices, and additionally has ferroelectric capacitors. In normal operation, the circuit operates at a high speed as in a logical operation of a Silicon device, and when necessary, it writes data in the ferroelectric capacitors.

The operation of the circuit disclosed in the above-mentioned unexamined patent publication (see pages 6–9 and FIG. 2 of the publication) will be explained. FIG. 8 shows the circuit configuration of FIG. 2 in the publication. The circuit has an FF that comprises two inverters: one consists of transistors 101 and 102, and the other consists of transistors 103 and 104. The output terminal of the former inverter is connected to the input terminal of the latter inverter, and the output terminal of the latter inverter is connected to the input terminal of the former inverter. Two memory nodes 109 and 110 are connected to bit lines 111 and 112 via pass transistors 105 and 106, respectively, whose gates are connected to a word line 113. Ferroelectric capacitors 107 and 108 are connected between a plate (PL) line 115 and the memory nodes 109 and 110 respectively.

READ and WRITE operations perform in a similar manner to usual flip-flop circuits.

The operation to store data (hereinafter referred to as STORE operation) into the ferroelectric capacitors 107 and 108 is performed as follows: Firstly, the voltage of the plate line 115 which is usually set to half the supply voltage Vdd is increased to the supply voltage Vdd. Then, the voltage is changed to the ground voltage. By this operation, the voltages applied to the ferroelectric capacitors 107 and 108 become opposite to each other, according to the voltages Q1 and Q2 of the memory nodes 109 and 110, respectively. Secondly, the voltage of the plate line 115 is set to 0 V and the voltage DD of a power line 114 is set to 0 V to remove power. By these operations, the polarization directions of the ferroelectric capacitors 107 and 108 are set opposite to each other.

The operation to recall data (hereinafter referred to as RECALL operation) from the ferroelectric capacitors 107 and 108 is performed as follows: The voltage DD of the power line 114 is increased gradually, while the voltage of the plate line 115 is set to 0 V. The change of the polarization state of the ferroelectric capacitors 107 and 108 varies depending on the direction of polarization and the direction of the voltage applied. For this reason, when the supply voltage is increased, one ferroelectric capacitor causes a polarization reversal while the other ferroelectric capacitor does not. This creates a difference in the effective capacitances of one ferroelectric capacitor and the other ferroelectric capacitor. This results in a difference in the increasing rates of the voltages of the memory nodes 109 and 110 due to the rise of the supply voltage. By using this difference, the voltages Q1 and Q2 of the memory nodes 109 and 110 can be reset.

However, the above-mentioned prior art has the following problems:

The first problem is that a polarization of a ferroelectric substance reverses when an electric field applied thereto exceeds a certain value (coercive electric field). Data "0" and "1" are expressed by the state of this polarization. When an electric field lower than the coercive electric field is applied, slight polarization reversal also occurs. Accordingly, even when a voltage lower than the coercive electric field is applied to the ferroelectric substance in the operations other than STORE and RECALL operations, the polarization state changes slightly. This repetition of applying the lower voltage causes a phenomenon called "disturbance" which destroys a polarization state to be maintained. In order to prevent the disturbance of the ferroelectric capacitors 107 and 108, the voltage applied to the ferroelectric capacitors 107 and 108 must be controlled precisely.

The second problems is that the ferroelectric capacitors 107 and 108 are connected to the two memory nodes 109 and 110 of the FF circuit so that the parasitic capacitances of the memory nodes 109 and 110 increase. Also while the FF section is in operation, a voltage is applied to the ends of the path from the ferroelectric capacitor 107 to the ferroelectric capacitor 108 via the plate line 115. The values of the leakage current of the ferroelectric capacitors 107 and 108 are higher than those of the leakage current of an insulator layer used for Silicon devices such as $SiO_2$. Therefore, a leakage current occurs in the above path while the FF circuit is in operation. In addition, during normal operation, a current that is necessary for holding the voltage of the plate line at Vdd/2 increases current consumption.

BRIEF SUMMARY OF THE INVENTION

An object of the present invention is to provide a method of driving a non-volatile flip-flop circuit which operates in an electrically stable manner, and when in normal operation operates at a high speed with low power consumption.

A method of driving a non-volatile flip-flop circuit according to the present invention, which can achieve the above-mentioned object, using variable resistor elements and comprising:

a first inverter having an input terminal and an output terminal which are connected to a first memory node and a second memory node, respectively, a second inverter having an input terminal and an output terminal which are connected to the second memory node and the first memory node, respectively, a first pass transistor which has a gate connected to a word line and is connected between a first bit line and the first memory node, a second pass transistor which has a gate connected to the word line and is connected between a second bit line and the second memory node, a first switching element for control and a first variable resistor element which are connected serially to each other and are connected between the first memory node and a plate line, and a second switching element for control and a second variable resistor element which are connected serially to each other and are connected between the second memory node and the plate line;

wherein the resistance values of the first and second variable resistor elements can be changed by the heat generated by a current;

the method comprising:

a STORE step and a subsequent RECALL step, the STORE step having a first step in which both the first and second variable resistor elements are made low resistive, a second step which follows the first step, and in which while either the first or second variable resistor element, whichever is connected to the memory node storing "0", is maintained low resistive, only the variable resistor element which is connected to the memory node storing "1" is made high resistive, and, in the RECALL step, "1" being set in the memory node which is connected to either the first or second variable resistor element, whichever is in a high resistive state, and "0" being set in the memory node which is connected to either the first or second variable resistor element, whichever is in a low resistive state.

DETAILED DESCRIPTION OF THE INVENTION

Figure 1:
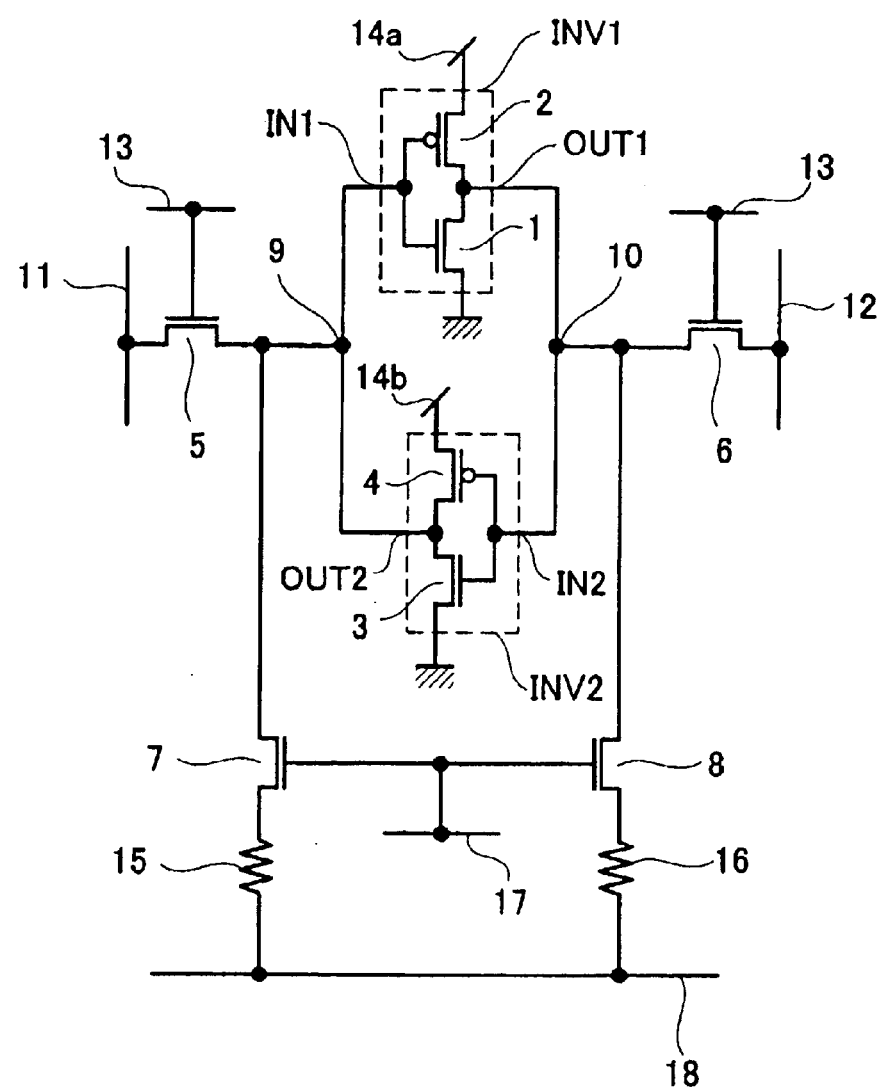
FIG. 1 is a circuit diagram showing a non-volatile flip-flop circuit according to an embodiment of the present invention.

Embodiments of the present invention will be described below with reference to the accompanying drawings. FIG. 1 is a circuit diagram showing a non-volatile flip-flop circuit according to an embodiment of the present invention. This non-volatile flip-flop circuit comprises a first transistor 1 and second transistor 2 which constitute a first inverter INV1, a third transistor 3 and fourth transistor 4 which constitute a second inverter INV2, a fifth transistor 5 and sixth transistor 6 which are first and second pass transistors, a first memory node 9, a second memory node 10, a word line 13, a first bit line 11, a second bit line 12, a first power line 14a, a second power line 14b, a seventh transistor 7 and eighth transistor 8 which are first and second switching elements for control, a first variable resistor element 15, a second variable resistor element 16, and control signal lines, i.e., a CS line 17 and a plate line 18. The first and second transistors 1 and 2 which constitute the first inverter INV1 complement each other, and so do the third and fourth transistors 3 and 4 which constitute the second inverter INV2. Described below is the case where the first, third, fifth–eighth transistors 1, 3, 5–8 are N-channel MOS transistors, and the second and fourth transistors 2 and 4 are P-channel MOS transistors.

The source of the first transistor 1 is grounded and the source of the second transistor 2 is connected to the first power line 14a. Similarly, the source of the third transistor 3 is grounded and the source of the fourth transistor 4 is connected to the second power line 14b. The gates of the first and second transistors 1 and 2 are connected to each other, constructing an input terminal IN1 of the first inverter INV1. The drains of the first and second transistors 1 and 2 are connected to each other, constructing an output terminal OUT1 of the first inverter INV1. Likewise, the gates and drains of the third and fourth transistors 3 and 4 are connected to each other, constructing an input terminal IN2 and output terminal OUT2 of the second inverter INV2. The input terminal IN1 of the first inverter INV1 is connected to the output terminal OUT2 of the second inverter INV2 via the first memory node 9. The output terminal OUT1 of the first inverter INV1 is connected to the input terminal IN2 of the second inverter INV2 via the second memory node 10. These construct a flip-flop which is a feedback circuit. The gates of the fifth and sixth transistors 5 and 6, which are pass transistors, are connected to the word line 13. This enables address selection. The seventh and eighth transistors 7 and 8, which are switching elements for control, are connected to the first and second memory nodes 9 and 10, respectively. The CS line 17, which is a control signal line, is connected to the gates of these switching elements for control, and one end of each of the first and second variable resistor elements 15 and 16 is connected thereto. The other end of each of the first and second variable resistor elements 15 and 16 is connected to the plate line 18.

The resistance values of the first and second variable resistor elements 15 and 16 can be changed after they are formed. In this embodiment, the variable resistor element uses, for example, a phase change material which comprises chalcogenide compounds such as GeTeSb. The resistance values of the first and second variable resistor elements 15 and 16 can be changed in a manner described later. This allows the flip-flop to maintain the information stored therein after power is removed, achieving non-volatility.

While in normal operation when power is supplied, the pass transistors, i.e., the fifth and sixth transistors 5 and 6, are placed in the ON state. This performs the READ operation in which the first and second bit lines 11 and 12 read stored information from the first and second memory nodes 9 and 10, or the WRITE operation in which information is written in the first and second memory nodes 9 and 10 via the bit lines 11 and 12. Needless to say, in the flip-flop circuit, a data "1", (i.e., "High") is stored in either the first memory node 9 or second memory node 10, and a data "0", (i.e., "Low") is stored in the other memory node.

When power is removed, the circuit performs the STORE operation in which information stored in the flip-flop is written in the first and second variable resistor elements 15 and 16. When power is supplied again, the circuit performs the RECALL operation in which information written in the first and second variable resistor elements 15 and 16 is recalled. These operations will be specifically described below.

(STORE Operation)

The STORE operation of the non-volatile flip-flop circuit shown in FIG. 1 will be described. The STORE operation comprises two steps described below. In the first step of the STORE operation, both the first and second variable resistor elements 15 and 16 are changed into a crystalline state so that their resistance values are made low.

In the second step of the STORE operation, either the first or second variable resistor element 15 or 16 is changed into an amorphous state so that its resistance is made high. By this step, information stored in the flip-flop is written in the first and second variable resistor elements 15 and 16. Specifically, while the variable resistor element connected to the memory node (either 9 or 10) which stores "0" is maintained in low resistive, only the variable resistor element (either 16 or 15) connected to the memory node (either 10 or 9) which stores "1" is changed into a high resistive state.

(1) First Step

Figure 2:
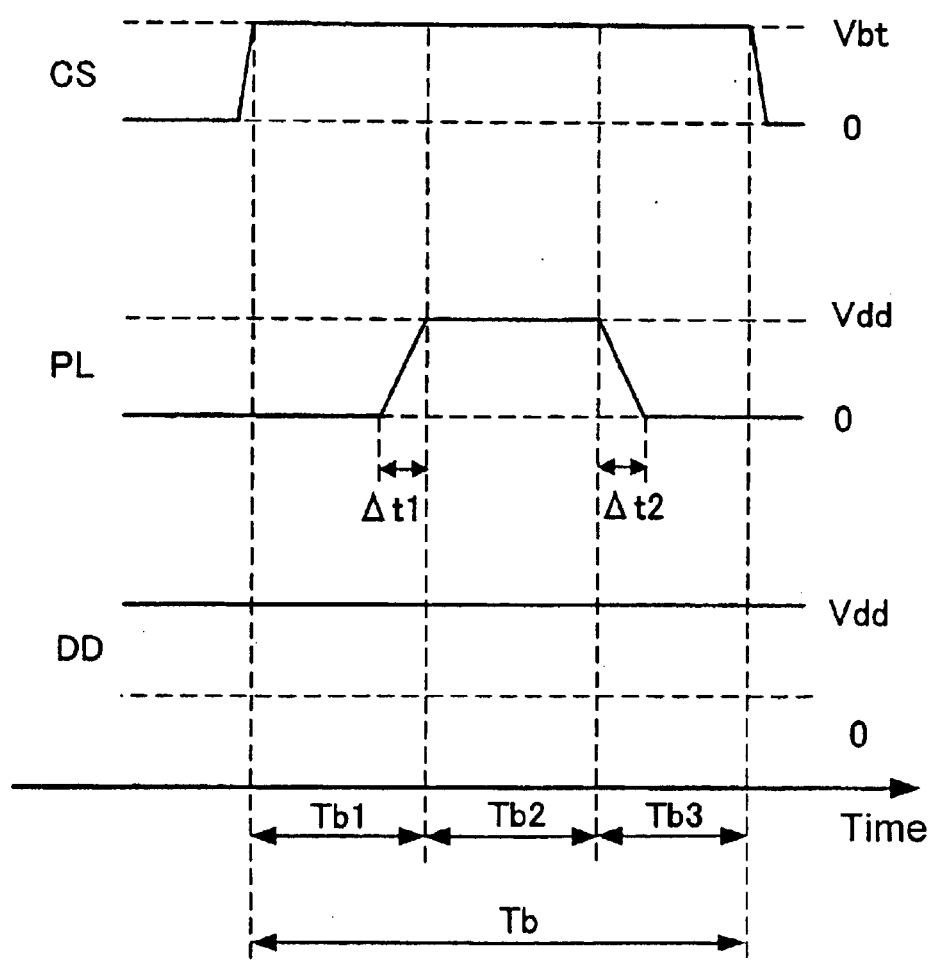
FIG. 2 is a timing chart showing the voltage applied to each control line in the first step of the STORE operation.

The first step of the STORE operation will be described with reference to FIGS. 2 and 3. FIG. 2 is a timing chart which shows the voltage applied to each control line of the circuit of FIG. 1 in the first step of the STORE operation. In FIG. 2, CS, PL, and DD represent the voltages of the CS line 17, plate line 18, power lines 14*a* and 14*b*, respectively.

Firstly, a voltage Vbt which has been raised from a supply voltage Vdd is applied to the CS line 17 from a certain moment during Time Tb. Immediately before the initiation of this time Tb1, the supply voltage Vdd is applied to the power lines 14*a* and 14*b* of the first and second inverters INV1 and INV2, and a ground voltage is applied to the plate line 18. When the time Tb1 starts, with this state maintained, the seventh and eighth transistors 7 and 8, which are switching elements for control, are turned on.

Secondly, after the time Tb1 has passed since the voltage application to the CS line 17 has been started, the supply voltage Vdd is applied to the plate during a time Tb2. As will be described later, in order to crystallize the first and second variable resistor elements 15 and 16 which have been heated to a high temperature by the heat generated by themselves, it is necessary to cool them gradually. Therefore, the voltage applied to the plate line is raised slowly (rise time $\Delta t1$), and lowered slowly (fall time $\Delta t2$).

That is, during the time $\Delta t1$ preceding the initiation of the time Tb2 in FIG. 2, the supply voltage Vdd is applied to the power lines 14*a* and 14*b* of the first and second inverters INV1 and INV2, and the seventh and eighth transistors 7 and 8 are in the ON state. While this state is maintained, the voltage applied to the plate line 18 is gradually increased from the ground voltage to a predetermined voltage. Then, in the subsequent time Tb2, the supply voltage Vdd is applied to the power lines 14*a* and 14*b* of the first and second inverters INV1 and INV2, and the seventh and eighth transistors 7 and 8, which are switching elements for control, are in the ON state. While this state is maintained, the voltage applied to the plate line 18 is maintained at a predetermined level (Vdd). Immediately after the time Tb2 terminates and the time Tb3 starts, the supply voltage Vdd is applied to the power lines 14*a* and 14*b* of the first and second inverters INV1 and INV2, and the seventh and eighth transistors 7 and 8, which are switching elements for control, are in the ON state. With this state maintained, the voltage applied to the plate line 18 is gradually decreased from the predetermined voltage (Vdd) to the ground voltage.

Even after the time Tb2 elapses, the voltage of the CS line 17 is maintained at a raised voltage level, i.e., the voltage Vbt, at least until the voltage of the plate line becomes 0 V. That is, Tb3 is longer than $\Delta t2$. More specifically, during the time Tb3 (excluding the time $\Delta t2$), the state in which the supply voltage Vdd is applied to the power lines 14*a* and 14*b* of the first and second inverters INV1 and INV2, the ground voltage is applied to the plate line 18, and the seventh and eighth transistors 7 and 8, which are switching elements for control, are in the ON state is maintained.

Thus, the seventh and eighth transistors 7 and 8 are placed in the ON state, and a current flows through the first and second variable resistor elements 15 and 16. The first and second variable resistor elements 15 and 16 are formed, for example, from phase change materials which comprise chalcogenide compounds such as GeTeSb. Phase change materials are crystallized and made low resistive when they are subjected to a certain amount of Joule heat and then gradually cooled. It is known that the amount of Joule heat necessary to crystallize the unit volume of a 190-nm-diameter phase change material having an insulating layer made of $SiO_2$ is about 1.6 pJ (S. Tyson et al., Aerospace Conference Proceedings, 2000 IEEE vol.5 pp 385–390).

A simulation was performed in the circuit shown in FIG. 1 to analyze the first step of the STORE operation under the conditions of applying the voltages CS, PL and DD according to the timing chart of FIG. 2. For example, the resistance value of the second variable resistor element 16 was set to 10 times as high as that of the first variable resistor element 15 in the initial state; the raised voltage Vbt applied to the CS line 17 was 3.9 V; and the time to apply voltage was as follows: Tb was 100 ns, Tb1 and Tb2 were 50 ns each. Since the object of this simulation was to simulate the heat value of the variable resistor elements, both Tb3 and $\Delta t$ were set to 0 ns. The diameters of the first and second variable resistor elements 15 and 16 were both set to 190 nm, and $SiO_2$ was used as an insulator layer of the resistor elements.

Figure 3:
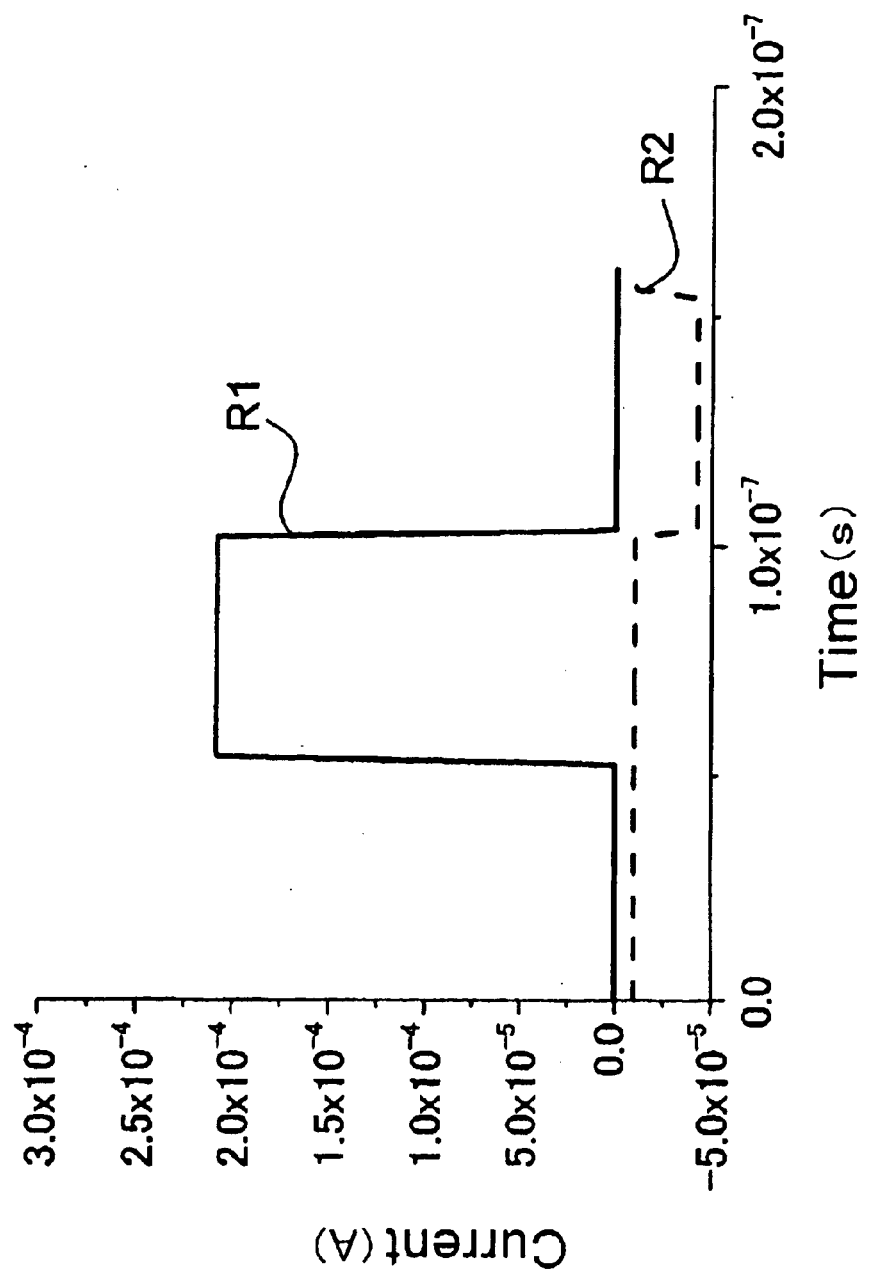
FIG. 3 shows the simulation result of the currents which flow through the two variable resistor elements in the first step of the STORE operation.

FIG. 3 shows the result of the simulation of the currents which flow through the first and second variable resistor elements 15 and 16 performed under these conditions. In FIG. 3, the direction of the current which flows from the first and second memory nodes 9 and. 10 to the plate line 18 is regarded as the positive direction. Now, assume that "1" (corresponding to the supply voltage Vdd) is stored in the first memory node 9 of the flip-flop, and "0" (corresponding to the ground voltage 0 V) is stored in the second memory node 10. This information is written in the first and second variable resistor elements 15 and 16.

Firstly, the voltage Vbt which had been raised to 3.9 V was applied to the CS line 17, and the seventh and eighth transistors 7 and 8 were placed in the ON state. Secondly, after the raised voltage Vbt was started to be applied the CS line 17, the voltage of the plate line 18 was maintained at 0 V during the time Tb1, i.e., 50 ns. The voltage DD of the power lines 14a and 14b was maintained at the supply voltage Vdd. At this time, the voltages at both ends of the first variable resistor element 15 were Vdd and 0 V. As shown in FIG. 3, a current of about 210 $\mu$A flowed through the first variable resistor element 15 (R1), and Joule heat of about 21 pJ was generated. The voltages of both ends of the second variable resistor element 16 (R2) were 0 V, a current did not flow through the second variable resistor element 16 (R2).

Subsequently, as shown in FIG. 2, the supply voltage Vdd was applied to the plate line 18 during the time Tb2 (50 ns) after time Tb1, maintaining the voltage of CS line at Vbt. The voltage DD of the power lines 14a and 14b was maintained at the supply voltage Vdd. At this time, the voltages of both ends of the second variable resistor element 16 (R2) were 0 V and Vdd. Thus, as seen from FIG. 3, a current of about 32 $\mu$A flowed through the second variable resistor element 16 (R2) in the direction opposite to that of the first variable resistor element 15 (R1), generating Joule heat of about 5.4 pJ. Since the voltages of both ends of the first variable resistor element 15 (R1) were Vdd, a current did not flow through the first variable resistor element 15 (R1). The amounts of Joule heat generated in the first and second variable resistor elements 15 and 16 in the above simulation are sufficient for crystallizing the resistor elements, if they are cooled gradually.

Thus, in the first step of the STORE operation, the raised voltage Vbt is applied to the CS line 17, which is a control signal line, and the seventh and eighth transistors 7 and 8, which are switching elements for control, are placed in the ON state. Subsequently, the voltage of the plate line 18 is set to 0 V over a predetermined period of time (Tb1), and then set to the voltage Vdd over a predetermined time (Tb2). These operations allowed currents to flow through the first and second variable resistor elements 15 and 16, thereby giving the Joule heat necessary to crystallize the resistor elements.

Then, the first and second variable resistor elements 15 and 16, which are heated by the Joule heat, need to be cooled necessary. The time needed for cooling depends on heat value, temperature, and the thermal characteristics (thermal conductivity, heat radiation characteristics) of the variable resistor elements and their surroundings, etc. For example, if resistance is low, a heat value becomes comparatively high, whereby a cooling time after a current flow stops is assumed to be comparatively long. On the other hand, if resistance is high, heat value becomes comparatively low, whereby a cooling time after a current flow stops is assumed to be comparatively short. Therefore, in this first step, it is not desirable to rapidly change the voltage applied to the first and second variable resistor elements 15 and 16. Regardless of whether the initial resistance values of the first and second variable resistor elements 15 and 16 are high or low, it is desirable to change the applied voltage with a gentle slope so that the resistor elements are cooled gradually. In other words, in FIG. 2, the rise time $\Delta$t1 of the pulse voltage applied to the plate line 18 is for assuring that the variable resistor element (the first variable resistor element 15 in the above simulation), which has been heated by a current flowing therethrough over the time Tb1, cools gradually. Similarly, the fall time $\Delta$t2 of the pulse voltage applied to the plate line 18 is for assuring that the variable resistor element (the second variable resistor element 16 in the above simulation), which has been heated by a current flowing therethrough over the time Tb2, cools gradually. Therefore, after the time Tb2 elapses, it is necessary to apply a voltage to the CS line over a period equal to $\Delta$t2, i.e., the fall time of the pulse voltage applied to the plate line 18, or longer. In other words, Tb3 needs to be greater than $\Delta$t2. For example, Tb3 is set to 50 ns and $\Delta$t1 and $\Delta$t2 are both adjusted within the range of 5 ns to 20 ns, depending on the material of the first and second variable resistor elements 15 and 16 or other conditions.

Described above is the case where the seventh and eighth transistors 7 and 8, which are switching elements for control, are placed in the ON state, and in that state, the time Tb1 during which the plate line 18 is set at 0 V is set to 50 ns, and the time Tb2 during which the plate line 18 is set to Vdd is set to 50 ns. However, this is not intended to be limiting. The times Tb1 and Tb2 may be set so that the Joule heat which is generated in the first and second variable resistor elements 15 and 16 is such that is needed to change the elements into a crystalline state. Instead of the pulse voltage, a DC voltage may be used.

(2) Second Step

The second step of the STORE operation will be described with reference to FIGS. 4 and 5. In this second step of the STORE operation which follows the first step, either the first and second variable resistor elements 15 and 16, whichever is connected to the memory node (9 or 10) storing "0", is maintained in low resistive, and in this state, either the variable resistor element 16 or 15, whichever is connected to the memory node (10 or 9) storing "1", is changed to high resistive.

Assume that the first and the first and second variable resistor elements 15 and 16 have been both made crystalline in the first step and their resistance values are approximately at the same low level. FIG. 4 is a timing chart which shows the voltage applied to each control line of the circuit of FIG. 1 in the second step of the STORE operation.

The raised voltage Vbt is applied to the CS line 17 from a certain moment over the time Tc, and the seventh and eighth transistors 7 and 8 are placed in the ON state. Specifically, while maintaining the state in which the supply voltage Vdd is applied to the power lines 14a and 14b of the first and second inverters INV1 and INV2 and the ground voltage is applied to the plate line 18, the seventh and eighth transistors 7 and B, which are switching elements for control, are placed in the ON state.

Now, assume that the voltage values of the first and second memory nodes 9 and 10 are maintained at Vdd and 0 V, respectively, which correspond to "1" and "0". Since the voltage of the plate line 18 is set to 0 V, the voltage of both ends of the first variable resistor element 15 is Vdd, and a large current flows through the first variable resistor element 15. In contrast, the voltage of both ends of the second variable resistor element 16 is 0 V, and thus almost no current flows through the second variable resistor element 16.

The first and second variable resistor elements 15 and 16 are formed of phase change materials such as GeTeSb, as already stated. If a phase change material is given a certain amount of Joule heat, heated above its melting point and cooled rapidly, it becomes amorphous and high resistive. The amount of Joule heat necessary to change the unit volume of a 190-nm-diameter phase change material having an insulating layer made of $SiO_2$ into an amorphous state is about 3.6 pJ (see the above-mentioned reference of S. Tyson et al.). The time Tc to apply a voltage to the control signal line, i.e., CS line 17, is adjusted so that only the first variable resistor element 15 is made amorphous, that is, high resistive. At this time, the second variable resistor element 16, through which almost no current flows, remains crystalline, that is, low resistive.

Figure 4:
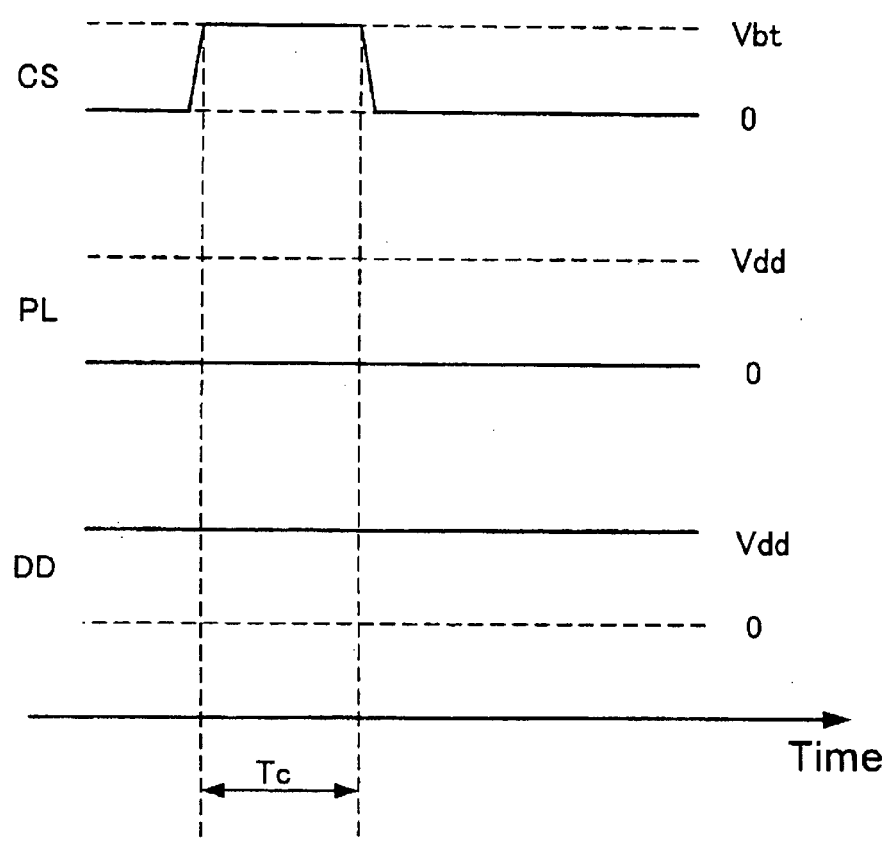
FIG. 4 is a timing chart showing the voltage applied to each control line in the second step of the STORE operation.

A simulation was performed in a similar manner to the first step to analyze the second step of the STORE operation in connection with the non-volatile flip-flop circuit of FIG. 1, under the conditions of applying the voltage CS, PL, and DD according to the timing chart of FIG. 4. For example, the raised voltage Vbt applied to the CS line 17 was set to 3.9 V, and the application time Tc was set to 10 ns. The first and second variable resistor elements 15 and 16 both had a diameter of 190 nm, an insulating layer of $SiO_2$ and a resistance value of 10 kΩ.

Figure 5:
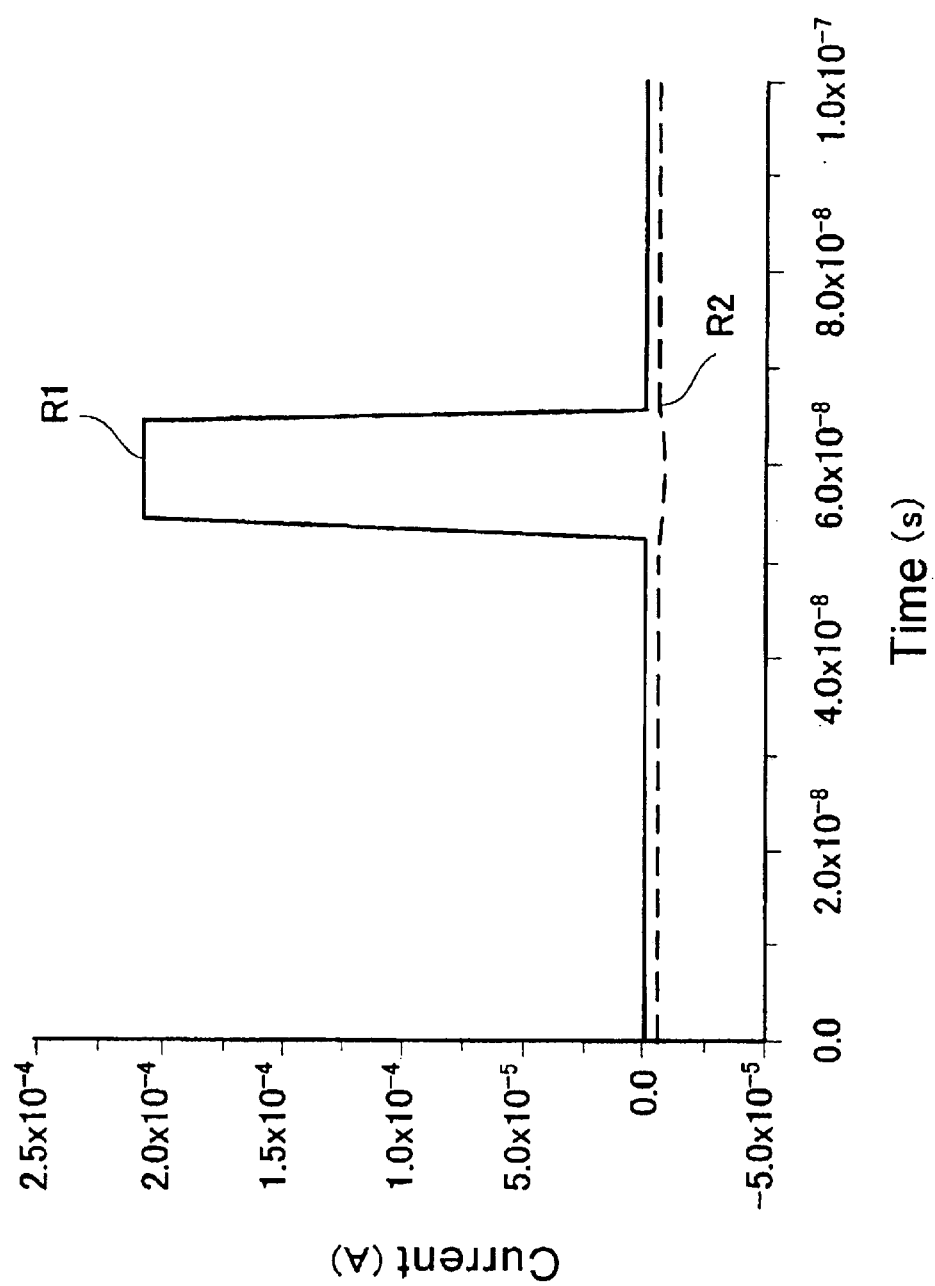
FIG. 5 shows the simulation result of the currents which flow through the two variable resistor elements in the second step of the STORE operation.

The simulation result of the currents which flow through the first and second variable resistor elements 15 and 16 performed under these conditions is shown in FIG. 5. As seen from FIG. 5, in the stable state, a current of about 208 μA flowed through the first variable resistor element 15. At this time, the amount of Joule heat generated in the first variable resistor element 15 was about 4.8 pJ. This value is sufficient to change the variable resistor element into an amorphous state. By rapidly changing the voltage of the CS line 17 to 0 V after the time Tc elapses and rapidly cooling the first variable resistor element 15, the first variable resistor element 15 can be changed from a crystal state into an amorphous state. Because almost no current flows through the second variable resistor element 16 at this time, the element remains crystalline. Accordingly, the first variable resistor element 15 becomes amorphous and high resistive. On the other hand, the second variable resistor element 16 remains crystalline and low resistive. Thus, for example, the resistance value of the first variable resistor element 15 becomes 10 times as high as that of the second variable resistor element 16, and the order of the resistance values of these elements becomes opposite to the initial state (before performing the first step). In contrast, if the voltage of the first memory node is 0 V and the voltage of the second memory node is Vdd, as a result of the second step, for example, the resistance of the second variable resistor element 16 becomes 10 times as high as that of the first variable resistor element 15, and the order of the resistance values of these elements become the same as in the initial state (before performing the first step).

As mentioned above, in the second step, after the Time Tc elapsed, in the state in which the supply voltage Vdd is applied to the power lines 14a and 14b of the first and second inverters INV1 and INV2 and the ground voltage is applied to the plate line 18, the seventh and eighth transistors 7 and 8, which are switching elements for control, are rapidly placed in the OFF state.

In this manner, the second step of the STORE operation achieved giving the amount of Joule heat necessary for changing only one of the variable resistor elements which is connected to either the two memory node, whichever has a data "1", of the flip-flop into an amorphous state by applying the raised voltage Vbt to the CS line 17 and placing the seventh and eighth transistors 7 and 8, which are the switching elements for control, in the ON state. By the first and second steps of the STORE operation, information is maintained in a non-volatile manner by writing the information stored in the flip-flop in the first and second variable resistor elements 15 and 16, namely, retaining the information as the order of the resistance values of the first and second variable resistor elements 15 and 16. Thus, after the completion of the STORE operation, power to the non-volatile flip-flop circuit can be removed without losing the information.

In the second step of the above STORE operation, the time Tc for keeping the switching elements for control placed in the ON state is about 10 ns. However, the time is not limited to this but may be such that-can give Joule heat necessary to change the variable resistor elements into an amorphous state.

Also in the above description, explained is the case where the raised voltage Vbt is applied to the CS line to place the seventh and eighth transistors 7 and 8 in the ON state. This is to inhibit a voltage drop due to the threshold voltage of the transistors. Therefore, the raised voltage Vbt is desirably applied (especially in the second step). However, the supply voltage Vdd can also achieve the above STORE operation.

(RECALL Operation)

Subsequently, the RECALL operation will be described with reference to FIGS. 6 and 7. Assume that the resistance value of the first variable resistor element 15 is 10 times as high as that of the second variable resistor element 16 as a result of the above STORE operation. After the STORE operation is completed, power to the non-volatile flip-flop circuit is removed in such a state of the resistance values. In consequence of this removal of power, the memory contents (i.e., the state in which a voltage corresponding to "1" (i.e., "High") is applied to one of the memory nodes, while a voltage is not applied to the other memory node, representing to "0" (i.e., "Low")) of the memory are eliminated from the first and second memory nodes 9 and 10. In the RECALL operation, the states of the memory nodes 9 and 10 before power is removed after the completion of the STORE operation are restored.

More specifically, in this RECALL step, "1" (i.e., "High") is stored in either the memory node 9 or 10, whichever is connected to the variable resistor element (15 or 16) with the higher resistance value, while "0" is stored in either the memory node 10 or 9, whichever is connected to the variable resistor element (16 or 15) with the lower resistance value.

Figure 6:
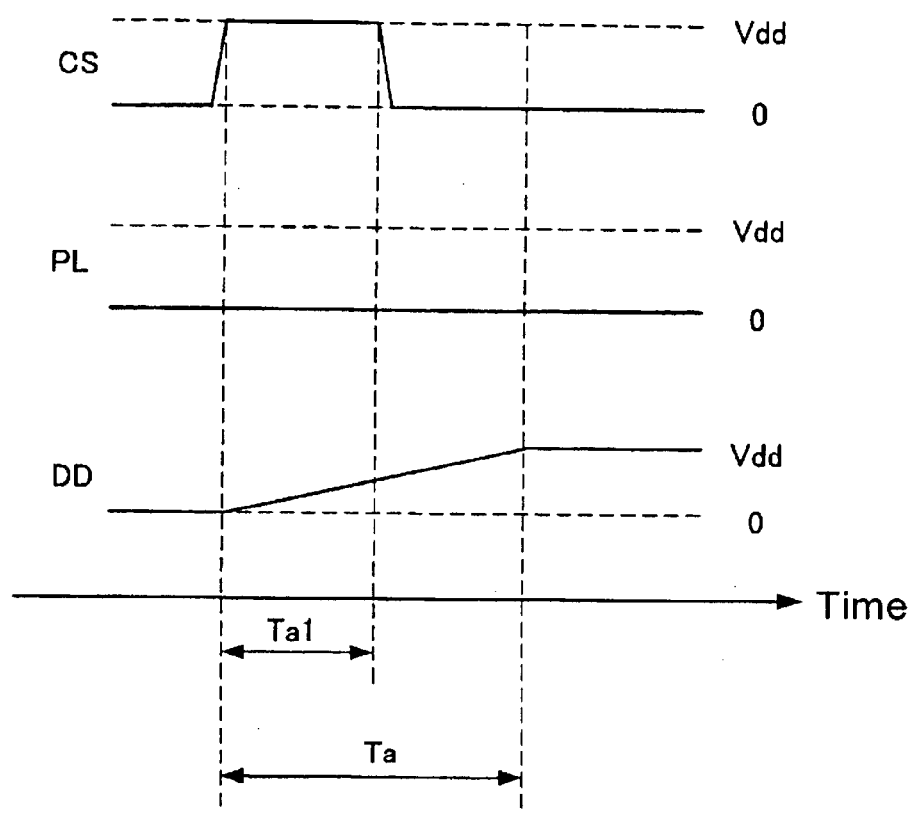
FIG. 6 is a timing chart showing the voltage applied to each control line in the RECALL operation.

FIG. 6 is a timing chart which shows the voltage applied to each control line of the circuit of FIG. 1 during the RECALL operation. Assume that the voltages of the word line 13, the first and second bit lines 11 and 12 are 0 V. The voltage DD of the power lines 14a and 14b is increased from a certain moment with a slope from 0 V to Vdd over Time Ta. At this time, the supply voltage Vdd is simultaneously applied to the CS line 17 to place the seventh and eighth transistors 7 and 8, which are switching elements for control, in the ON state.

More specifically, the seventh and eighth transistors 7 and 8, which are switching elements for control, are placed in the ON state, while maintaining the state in which the ground voltage is applied to the power lines 14a and 14b of the first and second inverters INV1 and INV2 and the ground voltage is applied to the plate line 18. Subsequently, while maintaining the state in which the ground voltage 0 V is applied to the plate line 18 and the seventh and eighth transistors 7 and 8, which are switching elements for control, are placed in the ON state, the voltage applied to the power lines 14a and 14b of the first and second inverters INV1 and INV2 is gradually increased from the ground voltage to the supply voltage.

Both the voltages Q1 and Q2 of the first and second memory nodes 9 and 10 increase as the voltage of the power lines 14a and 14b increases. However, since the first and second variable resistor elements 15 and 16, which are connected to the first and second memory nodes 9 and 10, respectively, have different resistance values, the rate of rise of the voltages Q1 and Q2 becomes different. As already stated, since the resistance value of the first variable resistor element 15 is higher than that of the second variable resistor element 16, the voltage Q1 of the first memory node 9 becomes higher than the voltage Q2 of the second memory node 10. When the difference between the voltages Q1 and Q2 becomes greater than a certain value, the voltage of the CS line 17 is lowered from the supply voltage Vdd to 0 V.

More specifically, while maintaining the state in which the ground voltage is applied to the plate line 18 and the voltage applied to the power lines 14a and 14b of the first and second inverters INV1 and INV2 is gradually increased to the supply voltage, the seventh and eighth transistors 7 and 8, which are switching elements for control, are placed in the OFF state. Then, while maintaining the state in which the ground voltage is applied to the plate line 18 and the seventh and eighth transistors 7 and 8, which are switching elements for control, are in the OFF state, the voltage applied to the power lines 14a and 14b of the first and second inverters INV1 and INV2 is gradually increased, and finally to the supply voltage (Vdd).

This makes the first and second variable resistor elements 15 and 16 disconnected from the flip-flop and latches the voltage Q1 and Q2. Then, after the voltage DD of the power lines 14a and 14b becomes Vdd, the voltage Q1 becomes Vdd and the voltage Q2 becomes 0 V.

With regard to the non-volatile flip-flop circuit shown in FIG. 1, a simulation was performed to analyze the RECALL operation under the conditions where the voltages CS, PL and DD are applied according to the timing chart of FIG. 6. For example, the minimum gate length of the MOS transistors (first–eighth transistors 1–8) was set to 0.35 $\mu$m, and the supply voltage Vdd was set to 3.3 V. The threshold voltage of the N-channel transistors (first, third, fifth–eighth transistors 1, 3, 5–8) was set to about 0.5 V, while the threshold voltage of the P-channel transistors (second and fourth transistors 2 and 4) was set to about 0.6 V. The rise time Ta of the voltage DD was set to 10 ns. The resistance value R2 of the second variable resistor element 16 was set to a similar level to the ON resistance value of the MOS transistors, which constitutes the flip-flop, i.e., 10 k$\Omega$, and the resistance value R1 of the first variable resistor element 15 was set to 10 times as high as R2, i.e., 100 k$\Omega$.

Figure 7:
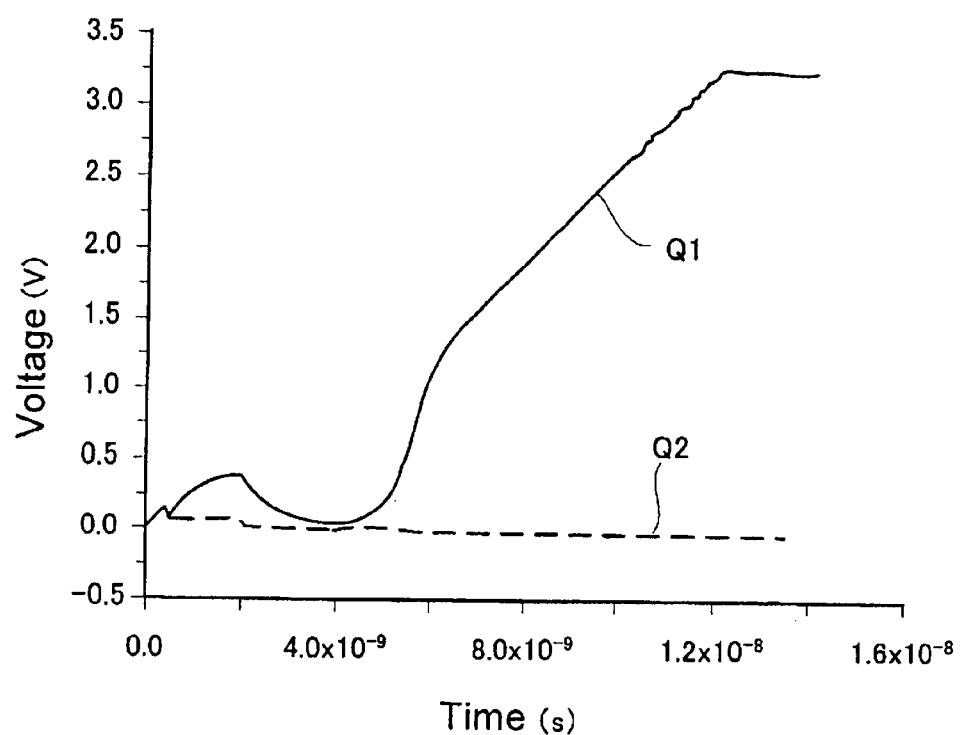
FIG. 7 shows the simulation result of the voltages of the memory nodes in the RECALL operation.

The simulation result of the voltages Q1 and Q2 of the first and second memory nodes 9 and 10 is shown in FIG. 7. The figure shows that both the voltages Q1 and Q2 rise at first. However, since there is a difference in the resistance values of the first and second variable resistor elements 15 and 16, which are connected to the first and second memory nodes 9 and 10, respectively, the voltages Q1 and Q2 become different. In this embodiment, for example, when the difference between the voltages Q1 and Q2 reached about 0.5 V (Ta1=5.4 ns), the voltage CS of the CS line 17 was reduced from Vdd. This caused the first and second variable resistor elements to be disconnected from the flip-flop, and after a lapse of time Ta (10 ns) since the voltage DD has started to rise, the voltage Q1 of the first memory node 9 increased to Vdd, the voltage Q2 of the second memory node 10 dropped to 0 V, and these values were maintained.

Explained above is the case where the voltage of the power lines 14a and 14b was reduced when the difference of the voltages Q1 and Q2 of the two memory nodes reached about 0.5 V. However, the voltage condition to reduce the power line voltage is not limited to the above condition, as long as the difference of the two memory nodes 9 and 10 is similar to the threshold voltage of the MOS transistor. Because the gate of the first transistor 1 of the flip-flop is connected to the first memory node 9 and its drain is connected to the second memory node 10, when the difference of the voltages Q1 and Q2 becomes equal to or greater than the threshold voltage of the first transistor 1, the first transistor 1 is placed in the ON state, and the second memory node 10 to which the drain is connected is set to 0 V.

Thus, it is confirmed that if there is a difference in the resistance values of the first and second variable resistor elements 15 and 16, the memory node corresponding to the variable resistor element with the higher resistance value is given a higher voltage, and this determines the voltages of the two memory nodes. In the above description, the resistance value of the first variable resistor element 15 was set 10 times as high as that of the second variable resistor element 16. However, the simulation proved that an operation similar to the above RECALL operation could be achieved with the resistance ratio being about 5:1. This means that the RECALL operation of the circuit shown in FIG. 1 has a very large margin of the resistance ratio.

Thus, the seventh and eighth transistors 7 and 8, which are switching elements for control, are placed in the ON state by the RECALL operation so that currents flow to the first and second variable resistor elements 15 and 16 and a difference occurs between the voltages of the first and second memory nodes 9 and 10, whereby the information stored in the flip-flop before power is removed can be recalled. In addition, placing the seventh and eighth transistors 7 and 8 in the OFF state when the difference in the voltages of the two memory nodes 9 and 10 becomes similar to or higher than the threshold voltage of the MOS transistor constituting the flip-flop allows to recall the information, with lower power consumption, stored in the flip-flop before power is removed. The RECALL operation can be performed normally with the resistance ratio of the first and second variable resistor elements 15 and 16 of about 5:1, indicating a large margin of operation. That is, the RECALL operation is stable to a variation or deviation of resistance values unless the order of the resistance values of the two variable resistor elements is reversed.

Explained above is the case where the voltage DD of the power lines 14a and 14b is increased gradually, but this should not be taken to be limiting. The voltage DD of the power lines 14a and 14b may be raised comparatively quickly and the voltage applied may be controlled so that the difference in the voltages of the two memory nodes 9 and 10 of the flip-flop becomes similar to the threshold voltage of the MOS transistor in the vicinity of the supply voltage at which the operation starts.

In the case explained above, the time Ta necessary for the RECALL operation is set to 10 ns. However, Ta is not limited to this and may be as low as about 1 ns.

Also explained is the case where Ta1 is 5.4 ns, but Ta1 is not limited to this. For example, after the unstable period occurring immediately after the voltage DD of the power lines 14a and 14b starts to rise, the voltage CS of the CS line 17 may be set to 0 V when the difference in the voltages of the first and second memory nodes 9 and 10 become equal to or greater than the threshold voltage of the MOS transistor.

As mentioned above, according to the present invention, maintaining information stored in a normal flip-flop in a non-volatile manner can be achieved by connecting a variable resistor element to each of two memory nodes of the normal flip-flop via switching elements for control.

(Normal Operation: READ/WRITE Operation)

Normal operations, i.e., a READ operation and WRITE operation will be described. In those operations, the CS line 17 is set to 0 V, the seventh and eighth transistors 7 and 8, which are switching elements for control, are placed in the OFF state, and the first and second variable resistor elements 15 and 16 are disconnected from the flip-flop. In this state, the supply voltage Vdd is applied to the word line 13 to placing the pass transistors, i.e., the fifth and sixth transistors 5 and 6, in the ON state. In this manner, the READ operation which reads stored information from the first and second memory nodes 9 and 10 to the bit lines 11 and 12, or the WRITE operation which writes information in the first and second memory nodes 9 and 10 from the bit lines 11 and 12, is performed. At this time, the first and second variable resistor elements 15 and 16 are disconnected from the flip-flop by the seventh and eighth transistors 7 and 8 and therefore do not serve as parasitic resistance in the READ and WRITE operations. The voltages Q1 and Q2 of the first and second memory nodes 9 and 10 are maintained at 0 V and Vdd, respectively. In this case, since almost no short circuit current flows through the inverters constructing the flip-flop, almost no leakage current flows in the circuit of this embodiment while on standby.

Figure 8:
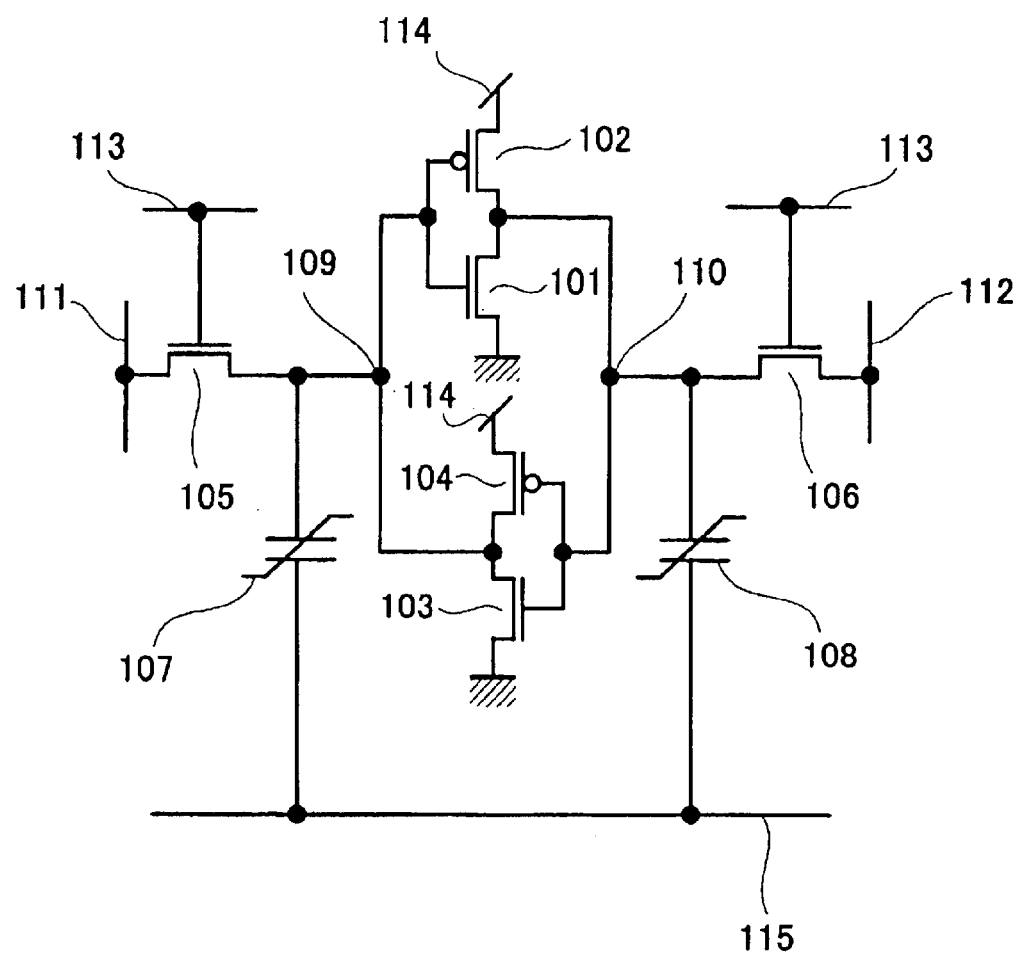
FIG. 8 is a circuit diagram of a non-volatile memory circuit in the prior art.

In prior art circuits as shown in FIG. 8, power consumption in the WRITE operation or READ operation is increased due to the leakage current of the ferroelectric substance which constructs the circuit, compared to normal flip-flops. In contrast, in the present invention, the variable resistor elements are disconnected by the switching elements for control (seventh and eighth transistors 7 and 8), and therefore a leakage current is inhibited and power consumption hardly increases. In a known circuit as shown in FIG. 8, its RECALL operation is unstable due to the disturbance of the ferroelectric substance. In contrast, this embodiment uses the variable resistor elements and can recall stored information with the resistance ratio of the two variable resistor elements of 5:1 or higher, which indicates a large margin of operation. Furthermore, the seventh and eighth transistors 7 and 8, which are switching elements for control, are placed in the OFF state when a difference in the voltages of the memory nodes 9 and 10 becomes similar to the threshold voltage of the MOS transistor, thereby allowing the circuit of this embodiment to operate with reduced power consumption.

Described above is the case where GeTeSb is used as a phase change material for the variable resistor elements, but any substance may be used as long as its resistance value can be changed by a current flow.

In the above case, as for the connection of the variable resistor element, the memory node, the switching element for control, the variable resistor element and the plate line are serially connected in this order. However, the order of the serial connection may be the memory node, the variable resistor element, the switching element for control, the other variable resistor element and the plate line.

Although the inverters having CMOS transistors is used to constitute the flip-flop in this embodiment, inverters comprising MOS transistors and resistors may also be used.

INDUSTRIAL APPLICABILITY

The present invention can provide a method of driving a non-volatile flip-flop circuit which can recall information stored in the flip-flop in stable operation when power is supplied. In addition, the present invention can provide a method of driving the non-volatile flip-flop circuit which operates at a high speed with low power consumption since the variable resistor elements are disconnected from the flip-flop during normal operation of the flip-flop, and thus the variable resistor elements do not serve as parasitic resistance.

What is claimed is:

1. A method of driving a non-volatile flip-flop circuit comprising:

a first inverter having an input terminal and an output terminal which are connected to a first memory node and a second memory node, respectively, a second inverter having an input terminal and an output terminal which are connected to the second memory node and the first memory node, respectively, a first pass transistor which has a gate connected to a word line and is connected between a first bit line and the first memory node, a second pass transistor which has a gate connected to the word line and is connected between a second bit line and the second memory node, a first switching element for control and a first variable resistor element which are connected serially to each other and are connected between the first memory node and a plate line, and a second switching element for control and a second variable resistor element which are serially connected to each other and are connected between the second memory node and the plate line;

wherein the resistance values of the first and second variable resistor elements can be changed by the heat generated by a current;

the method comprising:

a STORE step and a subsequent RECALL step, the STORE step having a first step in which both the first and second variable resistor elements are made low resistive, and a second step which follows the first step, and in which while either the first or second variable resistor element, whichever is connected to the memory node storing "0", is maintained low resistive, only the variable resistor element which is connected to the memory node storing "1" is made high resistive, and, in the RECALL step, "1" being set in the memory node which is connected to either the first or second variable resistor element, whichever is in a high resistive state, and "0" being set in the memory node which is connected to either the first or second variable resistor element, whichever is in a low resistive state.

2. A method of driving a non-volatile flip-flop circuit according to claim 1, wherein the first step comprising, in the order stated below:

a step for placing the first and second switching elements for control in the ON state, while maintaining the state in which the supply voltage is applied to the power lines of the first and second inverters and the ground voltage is applied to the plate line, a step for gradually increasing the voltage applied to the plate line from the ground voltage to a predetermined voltage, while maintaining the state in which the supply voltage is applied to the power lines of the first and second inverters, and the first and second switching elements for control are in the ON state, a step for maintaining the voltage applied to the plate line at the predetermined voltage, while maintaining the state in which the supply voltage is applied to the power lines of the first and second inverters, and the first and second switching elements for control are in the ON state, a step for gradually reducing the voltage applied to the plate line from the predetermined voltage to the ground voltage, while maintaining the state in which the supply voltage is applied to the power lines of the first and second inverters, and the first and second switching elements for control are in the ON state, and a step for maintaining the state in which the supply voltage is applied to the power lines of the first and second inverters, the ground voltage is applied to the plate line, and the first and second switching elements for control are in the ON state.

3. A method of driving a non-volatile flip-flop circuit according to claim 1, wherein the second step comprising, in the order stated below:

a step for placing the first and second switching elements for control in the ON state, while maintaining the state in which the supply voltage is applied to the power lines of the first and second inverters and the ground voltage is applied to the plate line, and a step for rapidly placing the first and second switching elements in the OFF state, while maintaining the state in which the supply voltage is applied to the power lines of the first and second inverters and the ground voltage is applied to the plate line.

4. A method of driving a non-volatile flip-flop circuit according to claim 1, wherein the RECALL step comprising, in the order stated below:

a step for placing the first and second switching elements for control in the ON state, while maintaining the state in which the ground voltage is applied to the power lines of the first and second inverters and the ground voltage is applied to the plate line, a step for gradually increasing the voltage applied to the power lines of the first and second inverters from the ground voltage to the supply voltage, while maintaining the state in which the ground voltage is applied to the plate line and the first and second switching elements for control are in the ON state, a step for placing the first and second switching elements for control in the OFF state, while maintaining the state in which the ground voltage is applied to the plate line and the voltage applied to the power lines of the first and second inverters is gradually increased to the supply voltage, and a step for gradually increasing the voltage applied to the power lines of the first and second inverters and finally applying the supply voltage to the power lines of the first and second inverters, while maintaining the state in which the ground voltage is applied to the plate line and the first and second switching elements for control are in the OFF state.

5. A method of driving a non-volatile flip-flop circuit according to claim 2, wherein the first and second switching elements for control are both transistors, and the voltage applied to the gate of the transistors is higher than the supply voltage.

6. A method of driving a non-volatile flip-flop circuit according to claim 3, wherein the first and second switching elements for control are both transistors, and the voltage applied to the gate of the transistors is higher than the supply voltage.

7. A method of driving a non-volatile flip-flop circuit according to claim 4, wherein the first and second switching element for control are both transistors and the voltage applied to the gate of the transistors is higher than the supply voltage.

8. A method of driving a non-volatile flip-flop circuit according to claim 1, wherein the first inverter comprises a first transistor and a second transistor complementing each other and each having a gate and a drain, the gates of the first and second transistors being connected to the first memory node and the drains of the first and second transistors being connected to the second memory node, and the second inverter comprises a third transistor and a fourth transistor complementing each other and each having a gate and a drain, the gates of the third and fourth transistors being connected to the second memory node and the drains of the third and fourth transistors being connected to the first memory node.

9. A method of driving a non-volatile flip-flop circuit according to claim 1, wherein the first and second inverters each comprises a MOS transistor and a resistor.

10. A method of driving a non-volatile flip-flop circuit according to claim 8, wherein the first and third transistors are N-channel MOS transistors and the second and fourth transistors are P-channel MOS transistors.

11. A method of driving a non-volatile flip-flop circuit according to claim 1, wherein the first and second variable resistor elements each comprises a phase change material of a chalcogenide compound.

12. A method of driving a non-volatile flip-flop circuit according to claim 1, wherein each of the first and second variable resistor elements has, in its high resistive state, a resistance value about 5 times as high as that in its low resistive state or higher.

13. A method of driving a non-volatile flip-flop circuit according to claim 8, wherein each of the first and second variable resistor elements has, in its high resistive state, a resistance value higher than the ON-resistance value of any of the first-fourth transistors.

* * * * *

UNITED STATES PATENT AND TRADEMARK OFFICE
CERTIFICATE OF CORRECTION

PATENT NO. : 6,862,226 B2
DATED : March 1, 2005
INVENTOR(S) : Kenji Toyoda et al.

It is certified that error appears in the above-identified patent and that said Letters Patent is hereby corrected as shown below:

<u>Title page,</u>
Item [75], Inventors, change "Toyonaka" to -- Osaka --

Signed and Sealed this

Twelfth Day of July, 2005

JON W. DUDAS
*Director of the United States Patent and Trademark Office*

UNITED STATES PATENT AND TRADEMARK OFFICE
CERTIFICATE OF CORRECTION

PATENT NO. : 6,862,226 B2
DATED : March 1, 2005
INVENTOR(S) : Kenji Toyoda et al.

It is certified that error appears in the above-identified patent and that said Letters Patent is hereby corrected as shown below:

Column 14,
Line 7, change "comprising:" to -- comprising; --.

Signed and Sealed this

Twenty-seventh Day of September, 2005

JON W. DUDAS
*Director of the United States Patent and Trademark Office*